(12) United States Patent
Tourné

(10) Patent No.: US 6,834,131 B2
(45) Date of Patent: Dec. 21, 2004

(54) SYSTEM AND METHOD FOR INTEGRATING OPTICAL LAYERS IN A PCB FOR INTER-BOARD COMMUNICATIONS

(75) Inventor: Joseph A. A. M. Tourné, Helmond (NL)

(73) Assignee: Viasystems Group, Inc., St. Louis, MO (US)

(*) Notice: Subject to any disclaimer, the term of this patent is extended or adjusted under 35 U.S.C. 154(b) by 185 days.

(21) Appl. No.: 10/179,758

(22) Filed: Jun. 25, 2002

(65) Prior Publication Data

US 2003/0006068 A1 Jan. 9, 2003

Related U.S. Application Data

(60) Provisional application No. 60/303,380, filed on Jul. 6, 2001.

(51) Int. Cl.[7] ................................................. G02B 6/12
(52) U.S. Cl. ........................ 385/14; 385/129; 385/131; 385/132
(58) Field of Search ............................. 385/14, 88, 92, 385/129–132; 438/29, 31

(56) References Cited

U.S. PATENT DOCUMENTS

| | | | | |
|---|---|---|---|---|
| 3,972,755 A | * | 8/1976 | Misfeldt ...................... 216/20 |
| 5,054,870 A | * | 10/1991 | Losch et al. ................... 385/14 |
| 5,680,698 A | | 10/1997 | Armington et al. |
| 5,808,272 A | | 9/1998 | Sun et al. |
| 5,891,795 A | * | 4/1999 | Arledge et al. .............. 438/613 |
| 6,185,354 B1 | * | 2/2001 | Kronz et al. ................. 385/129 |
| 6,370,292 B1 | * | 4/2002 | Strake .......................... 385/14 |
| 6,611,635 B1 | * | 8/2003 | Yoshimura et al. ........... 385/14 |
| 6,760,497 B1 | * | 7/2004 | Straub .......................... 385/14 |

* cited by examiner

*Primary Examiner*—Frank G. Font
*Assistant Examiner*—Christopher M. Kalivoda
(74) *Attorney, Agent, or Firm*—Dunlap, Codding & Rogers, P.C.

(57) ABSTRACT

Polymers of differing refraction indices are embedded within a PCB to provide optical connectivity of the PCB with other circuit boards via an optic backplane. The creation of islands of polymer material of refractive index n1 completely surrounded by polymer material with refractive index n2 where n1 has a higher index than n2 allows the islands of n1 indexed polymer to serve as optical waveguides. A process of forming a multi-layered PCB with the optical waveguide islands using successive laminations and using laser ablation to write the optical connection scheme is taught. Further, the use of uniquely marked targets in a copper layer to align the optical waveguides in production is also taught. Additionally, the use of clearing polymer materials and reinforcing polymer voids with prepreg lamination to allow a simple, high tolerance insertion of through-holes is taught.

9 Claims, 8 Drawing Sheets

SYSTEM AND METHOD FOR INTEGRATING OPTICAL LAYERS IN A PCB FOR INTER-BOARD COMMUNICATIONS

CROSS REFERENCE TO RELATED APPLICATIONS

This application claims the benefit of U.S. Provisional Application No. 60/303,380 filed Jul. 6, 2001.

BACKGROUND OF THE INVENTION

1. Field of the Invention

The present invention relates generally to the field of printed circuit boards. More particularly, the present invention relates to multi-level printed circuit boards (or "PCBs") that integrate optical data communications with other boards without electrical connections. That is, the present invention relates to backplane circuit boards that integrate photonic connection.

2. Background Information

Today, much of the world's communication is carried on optical fibers, the data encoded in modulated light. Transmission rates are measured in billions of bits per second, until the data reaches its destination. There, the light is converted into electrical impulses so that it may be routed electronically. The result is lower data rates and increased delay.

Opto-electronic devices are being developed that incorporate waveguide structures on silicon substrates allowing for integration of light buses and electrical buses. These integrated devices will replace discrete components and make the transition from photon streams to electron streams more efficient and/or eliminate the transition altogether. Clearly, the ultimate efficiency will be achieved when no conversion from light to electrical signals is required, thus enabling communication as light from source to destination.

One of the impediments to achieving this objective is the backplane. The backplane is the interconnecting point for devices in a system and may be passive or intelligent. Typically, devices (sometimes referred to as "daughter boards") are plug into a backplane through mechanical means. Additional cabling may be required to interconnect devices to each other or other points on the backplane resulting in slower data transfer rates, increased opportunities for failure, and increased costs. Opto-electronic devices require an electrical and/or an optical interface to the backplane.

Typically, backplanes and daughter boards are constructed on printed circuit boards (PCBs) on to which discrete components are mounted. What is needed are daughter-boards and backplanes constructed from PCBs that have both electrical and optical interfaces so as to eliminate additional cabling and to reduce or eliminate the need to convert from light signals to electrical signals. Such PCBs would also incorporate passive components such as multiplexers, demultiplexers, transducers and interferometers to effect optical signaling.

SUMMARY OF THE INVENTION

An object of the present invention is to integrate an optical transmitting material with a PCB to allow optical signals to be transmitted between circuit boards.

Another object of the present invention is to integrate optical polymers with PCB production to allow optical signal transmission.

Still another object of the present invention is to integrate a circuit board with an optical backplane to communicate using optical transmission to facilitate handling, insertion and removal of daughter boards without the need for connection cabling.

Yet another object of the present invention is to define optical transmitting polymers (optical waveguides) in a PCB by writing the connection scheme with a laser.

A further object of the present invention is to develop a method for producing PCBs integrated with optical waveguides using laser technology.

Yet a further object of the present invention is to develop a method for integrating optical waveguides with a PCB using successive laminations of optical conductive materials of differing refractive indices.

Still another object of the present invention is to use target marks on a copper layer to align optical waveguide positioning.

A PCB is designed to generate optical signals that allow an optical backplane to communicate with an inserted circuit board without use of electrical cabling. A surface or connector on the PCB is designed to allow transmission of light energy (signals). A preferred implementation is to use a polymer such as Polyguide™. The polymer used needs to have good optical properties and high temperature resistance.

The PCB is laminated with a surface coat of a material having a specific refraction index, n2. In one embodiment of the present invention, the exterior laminate is a polymer material such as Polyguide™. The polymer layer is laminated over a copper layer. The copper layer is roughed prior to lamination by chemical or mechanical or combination process to improve adhesion. The entire PCB surface is then covered with the polymer.

A second polymer layer is then layered on top of the first polymer layer. This layer has a different refraction index, n1. The optical signal is transmitted in the second polymer layer.

The layers are then channeled by an automated method such as laser ablation. The channeling process leaves a void in the polymer layers. The copper layer is exposed where the dual polymer layers are channeled. Alignment of the laser ablation is to a recognizable pattern as a mark on the surface copper layer. The mark which is etched on the copper is a shape designed for easy recognition by the automated laser tools.

Those channels or voids are then filled in with the polymer having refraction index n2. The second polymer with the higher refraction index, n1, is sandwiched by the first polymer. The sandwiched polymer layer serves as an optical waveguide. The waveguide also incorporates other passive components such as multiplexers, de-multiplexers, transducers and interferometers to effect optical signaling.

Those locations where through-holes are to be drilled are channeled by a laser ablation process prior to the through hole drilling. The multi-layer PCB is finished by a final lamination of "prepeg" and a copper foil deposit on both top and bottom. Then the through holes are drilled finishing the optical signal transmission.

DETAILED DESCRIPTION

Figure 1:
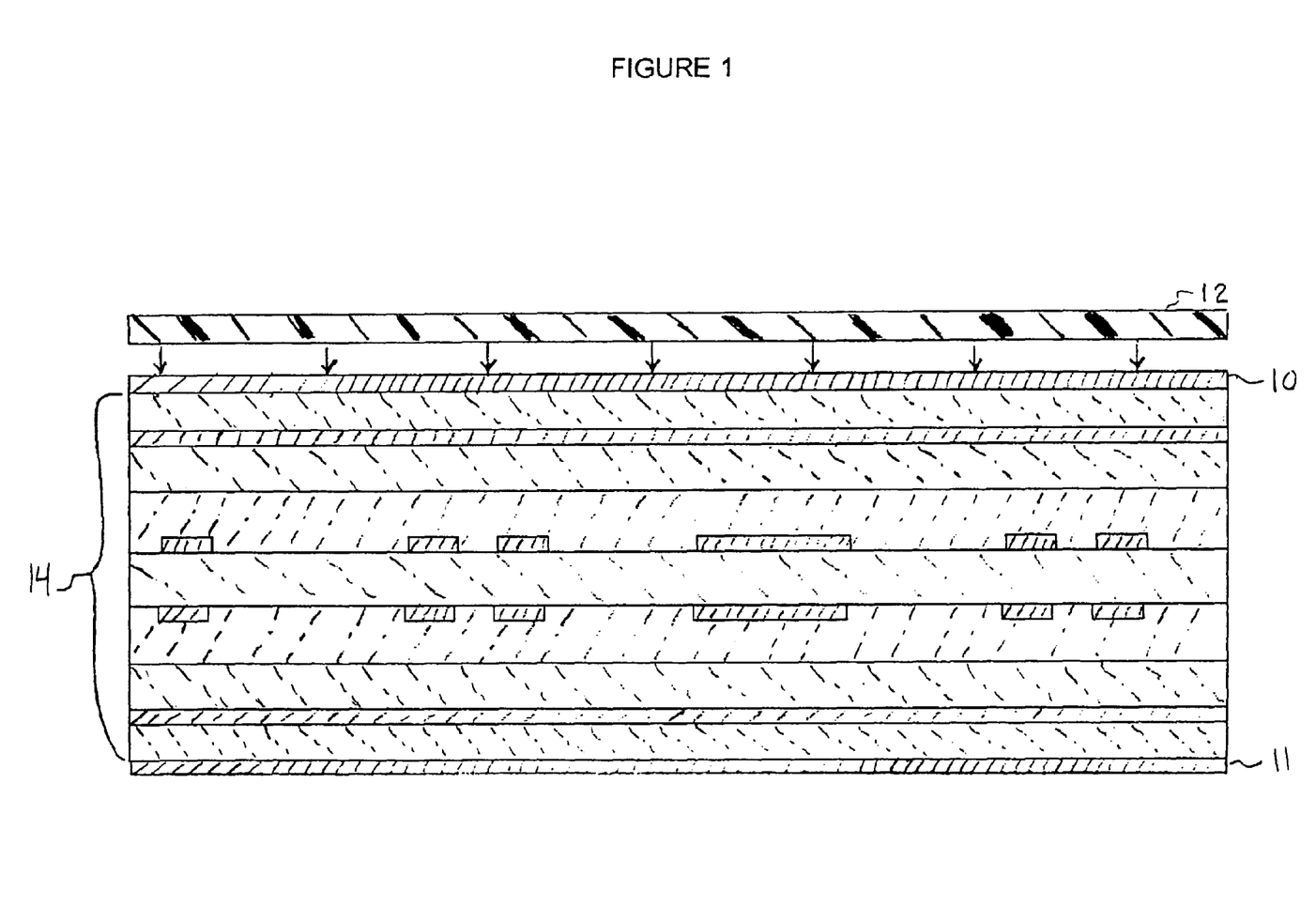
FIG. 1 illustrates a sectional view of a partially finished multi-layered PCB with an outer copper layer being covered with a polymer layer.

Referring to FIG. 1, a sectional view is illustrated of a multi-layered PCB with the outer most layers of copper, at an initial stage of optical integration. A multi-layered PCB 14 is covered top and bottom with copper layers 10,11. In this way, the PCB is first built for supporting electrical circuitry and functions, and then incorporates an optical conductive layer into its structure. The core of the multi-layer PCB is processed before laminating a first optical conductive layer 12. According to one embodiment of the present invention the optical conductive layer 12 is a polymer material sold under the tradename Polyguide™. The first polymer laminate layer 12 has a specific refraction index n2. The laminate covers the entire top surface area of the PCB, over the top copper layer 10.

According to one embodiment of the present invention, the top copper layer 10 is roughened prior to laminating the surface with the polymer coat 12 in order to improve adhesion. For example, a chemical, mechanical or combination chemical and mechanical abrasion process may be used. Other abrasion processes as known may be employed.

The optical polymer material is best suited for practice of the present invention if it has the following characteristics: good optical properties (i.e. low dispersion); high temperature and abrasion resistance to avoid damage to the material during fabrication and assembly; and a Z-axis coefficient of expansion comparable to the glass reinforced material used in the PCB. A typical epoxy based system has a thermal expansion coefficient (CTE) in the range of 100–150 ppm in the Z-axis. CTE in the X-axis and Y-axis is in the range of 16–18 ppm.

Figure 2:
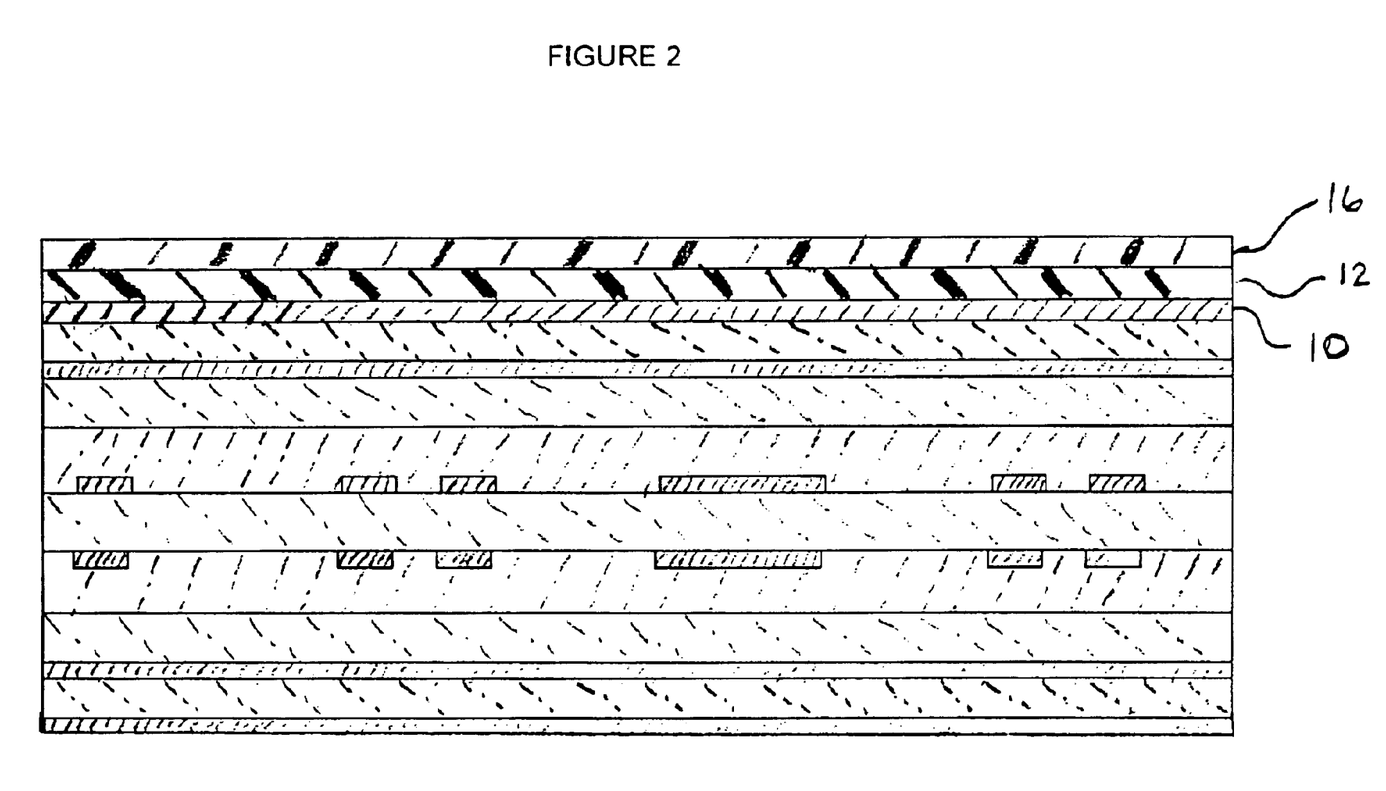
FIG. 2 illustrates a sectional view of a partially finished multi-layered PCB with a second polymer layer on top of the first polymer layer.

Referring to FIG. 2, a sectional view of a partially finished multi-layered PCB is illustrated at a subsequent stage of processing, with a second polymer layer on top of the first polymer layer. A second polymer layer 16 is laminated on top of the first polymer layer 12. The second polymer layer 16 covers the entire top surface area. The second polymer layer 16 requires the same properties as the first polymer layer 12.

The second polymer laminate has a specific refraction index n1. Refraction index n1 is greater than refraction index n2. The optical signal is transmitted in the n1 index layer.

Figure 3:
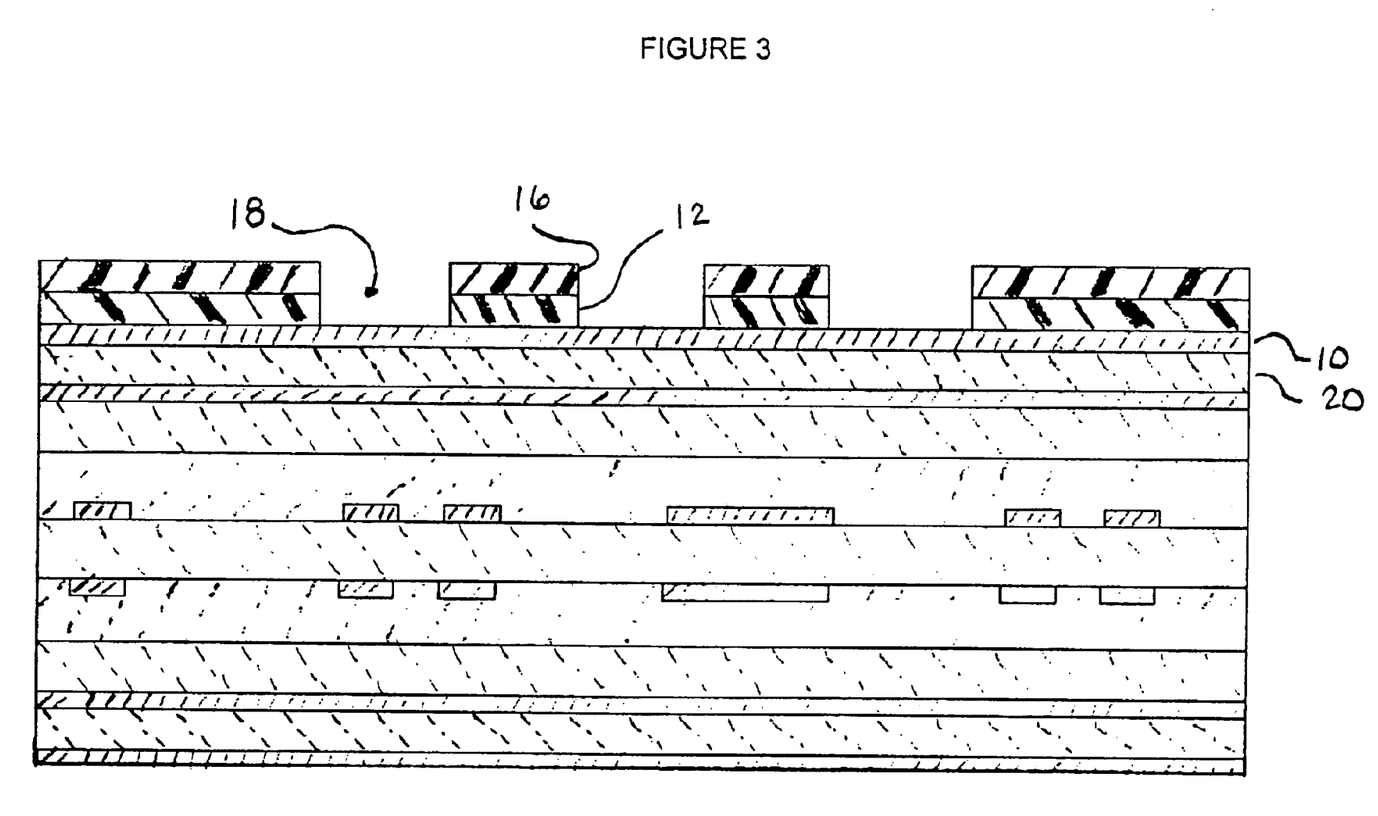
FIG. 3 illustrates a sectional view of the first and second polymer layers channeled by laser ablation.

Referring to FIG. 3, a sectional view is illustrated of the first and second polymer layers channeled by laser ablation. The two optical conductive polymer layers 12, 16 are channeled creating a void 18 in the first and second polymer layers. According to one embodiment of the present invention laser ablation is used. The laser has an automatic depth control. The laser has insufficient energy to cut the copper layer 10. The copper integrity is maintained so that the dielectric layer 20 just below the copper layer 10 is not penetrated. Other methods and processes that create cavities or voids in the two polymer layers down to the copper layer 10 will not affect the implementation of the present invention.

Figure 3A:
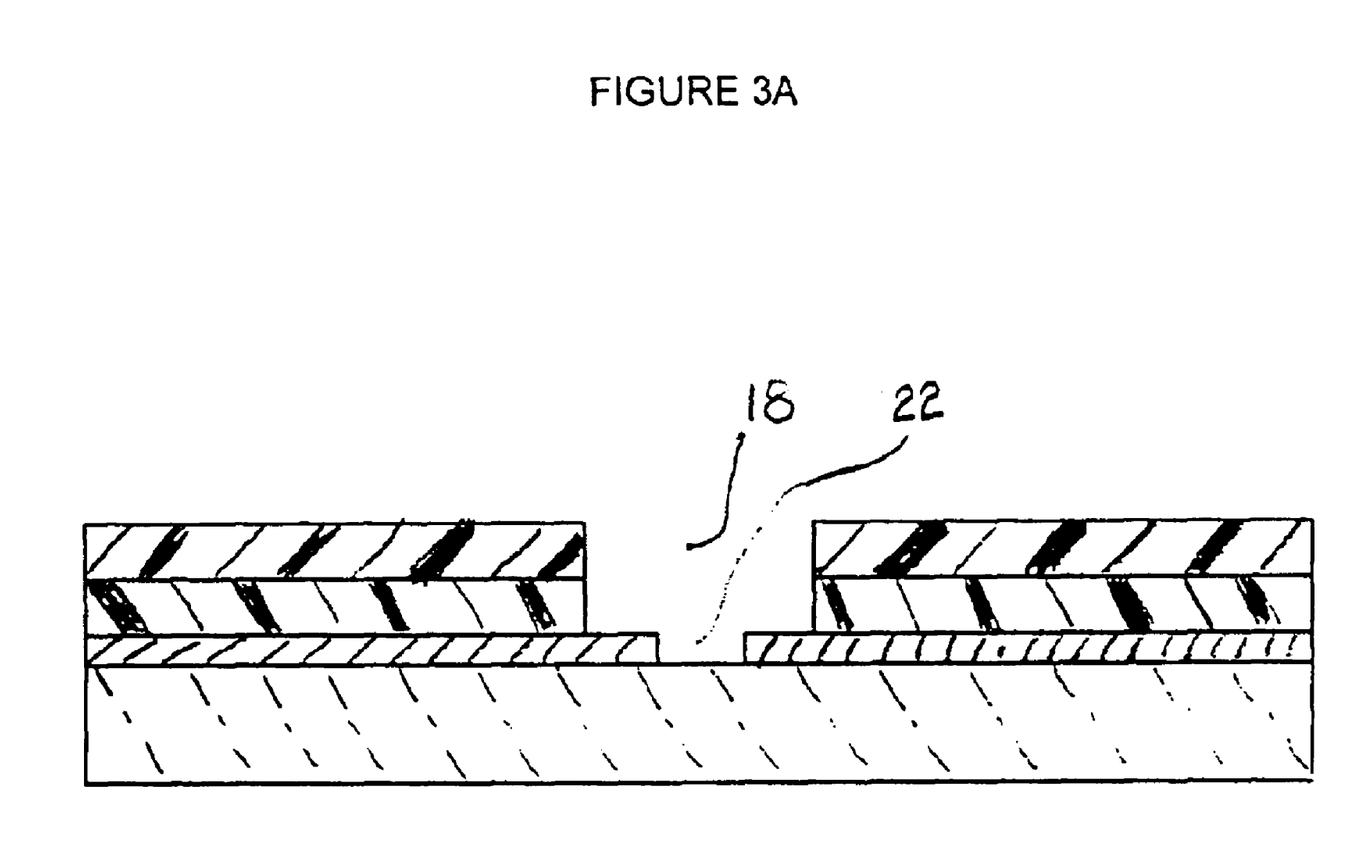
FIG. 3a illustrates a sectional view of the surface copper layer marked with a unique, easily recognizable pattern.

Referring to FIG. 3a, a sectional view is illustrated of the surface copper layer marked with a unique, easily recognizable pattern. The copper is marked in some of the locations where the polymer layers have been voided 18. One implementation of the present invention etches or marks the copper layer to create a target 22 for alignment of laser ablation processes. The targets 22 are positioned so as not to interfere with the circuitry and PCB design logic. An embodiment of the present invention places these "alignment" targets or features on the edges of PCB. Multiple marks are used; the more marks the greater the accuracy. The targets 22 are uniquely shaped so as to facilitate automatic recognition. According to one aspect of the present invention, the copper is etched with chemicals. Alternatively, the present invention uses a laser to mark the alignment feature in the copper layer. As further alternative, the present invention uses a mechanical process to mark the copper targets.

Figure 4:
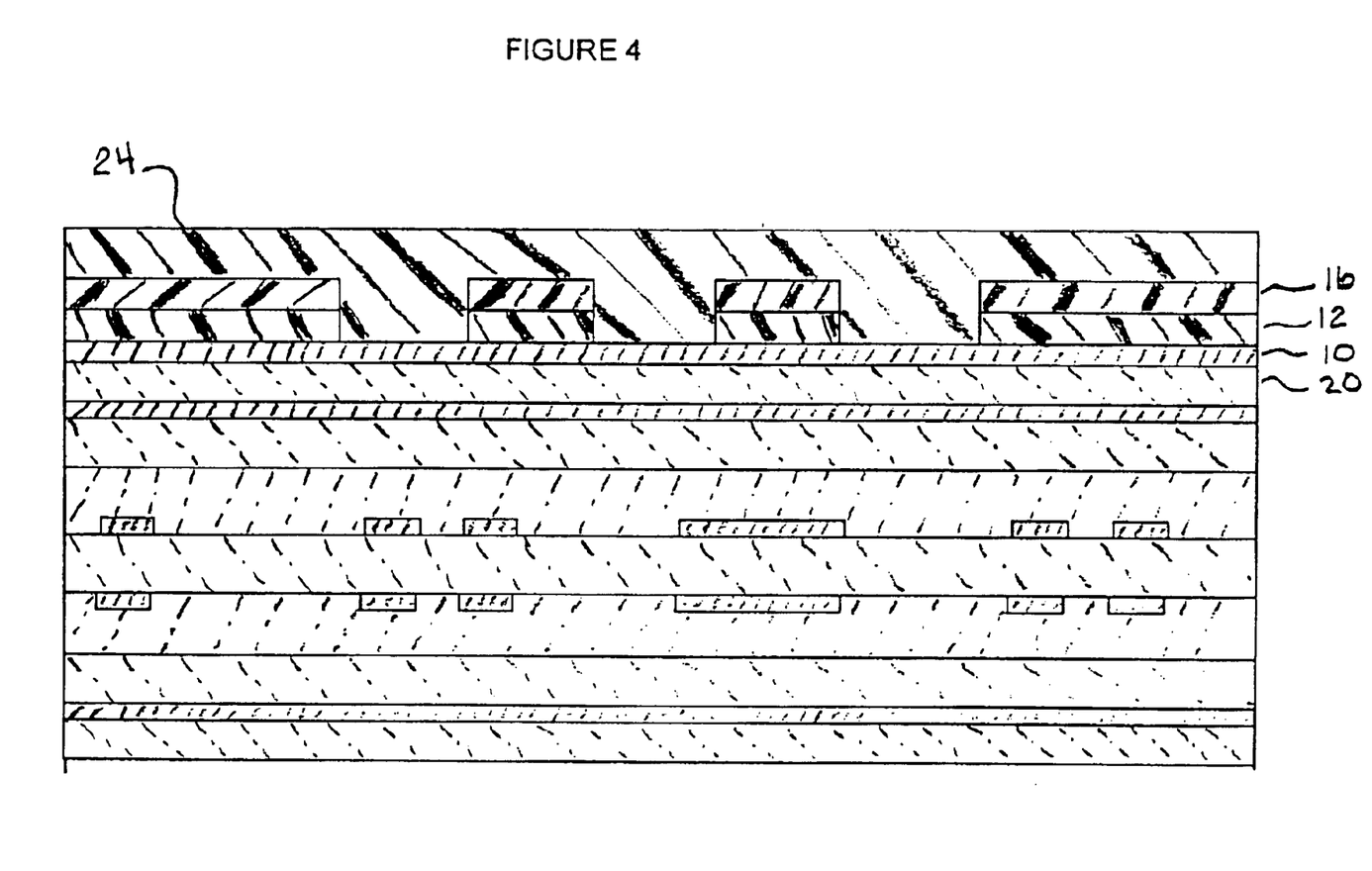
FIG. 4 illustrates a sectional view of the multi-layered PCB after an additional coat of the first polymer material has been layered over the top polymer layer, filling in the laser created channels.

Referring to FIG. 4, a sectional view is illustrated of a multi-layered PCB after an additional coat of the first polymer material has been layered over the top polymer layer, filling in the laser created channels. A third polymer layer 24 is laminated over the top surface of the PCB, covering the PCB to a uniform thickness. The voids created by laser ablation are filled. The third polymer layer is of the same refraction index, n2, as the first polymer layer 12. When the polymer layer voids are filled in, islands of the second polymer layer 16 with refraction index n1 result. These islands are referred to as "optical waveguides". The optical waveguides are surrounded by polymer material with lesser refraction index n2.

These optical waveguide islands 16 transmit optical signals and allow inter-circuit board connectivity via an optical backplane without the need for electrical cabling. The laser ablation process defines the optical waveguides, writing the connection scheme for the PCB and backplane. Other passive components such as multiplexers, de-multiplexers, transducers and interferometers are also integrated in the circuitry to effect optical signaling. The optical waveguides transmit the optical signals allowing inter-board communications.

Figure 5:
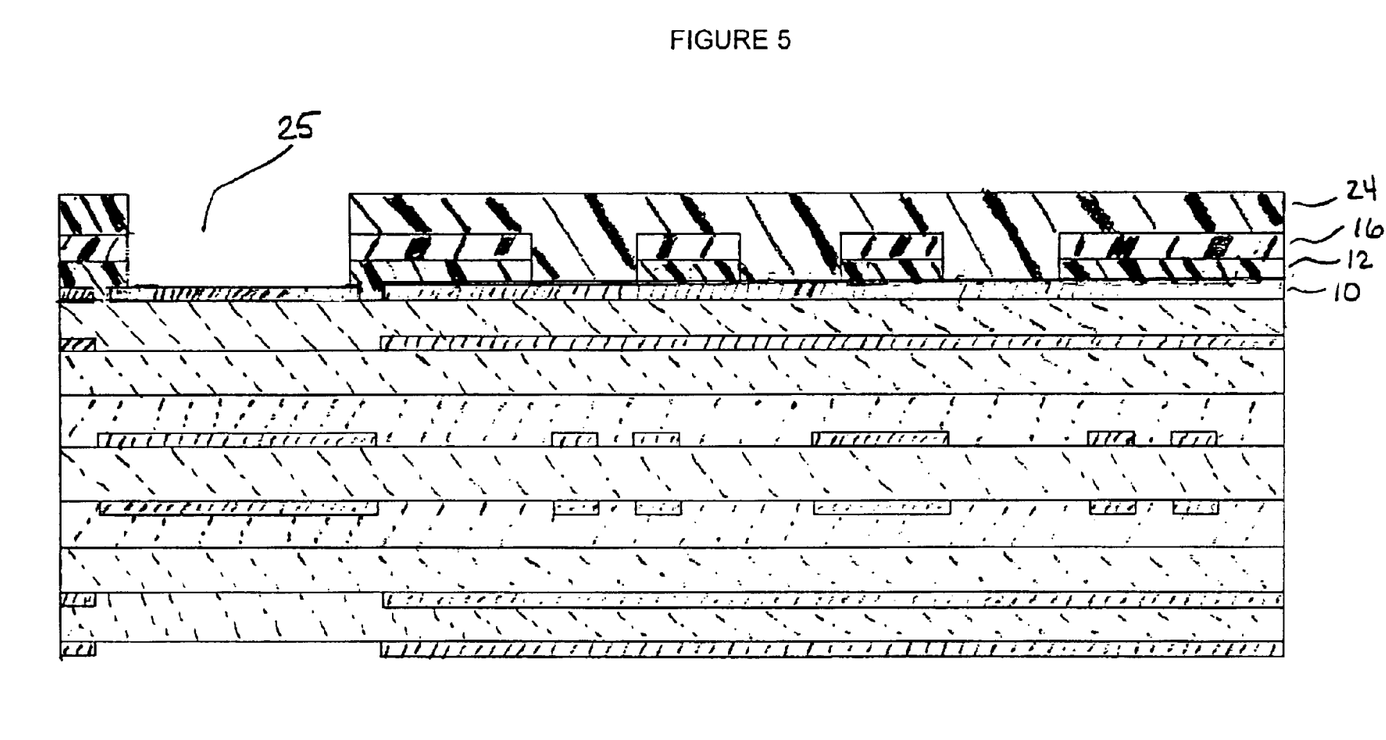
FIG. 5 illustrates a sectional view of the multi-layered PCB further channeled in the location where through-hole will be drilled.

Referring to FIG. 5, a sectional view is illustrated of the multi-layered PCB further channeled in the location where a through-hole will be drilled. Where a through-hole is to be located, a void 25 is created in the multiple layers of polymer above the top copper layer 10. As described supra, laser ablation process is employed to remove the polymer material 12, 16, 24 to the copper layer 10. It is noted that other processes, not herein described, that remove (i.e. channel) polymer layers in the multi-layered PCB will allow the present invention to be practiced.

Figure 6:
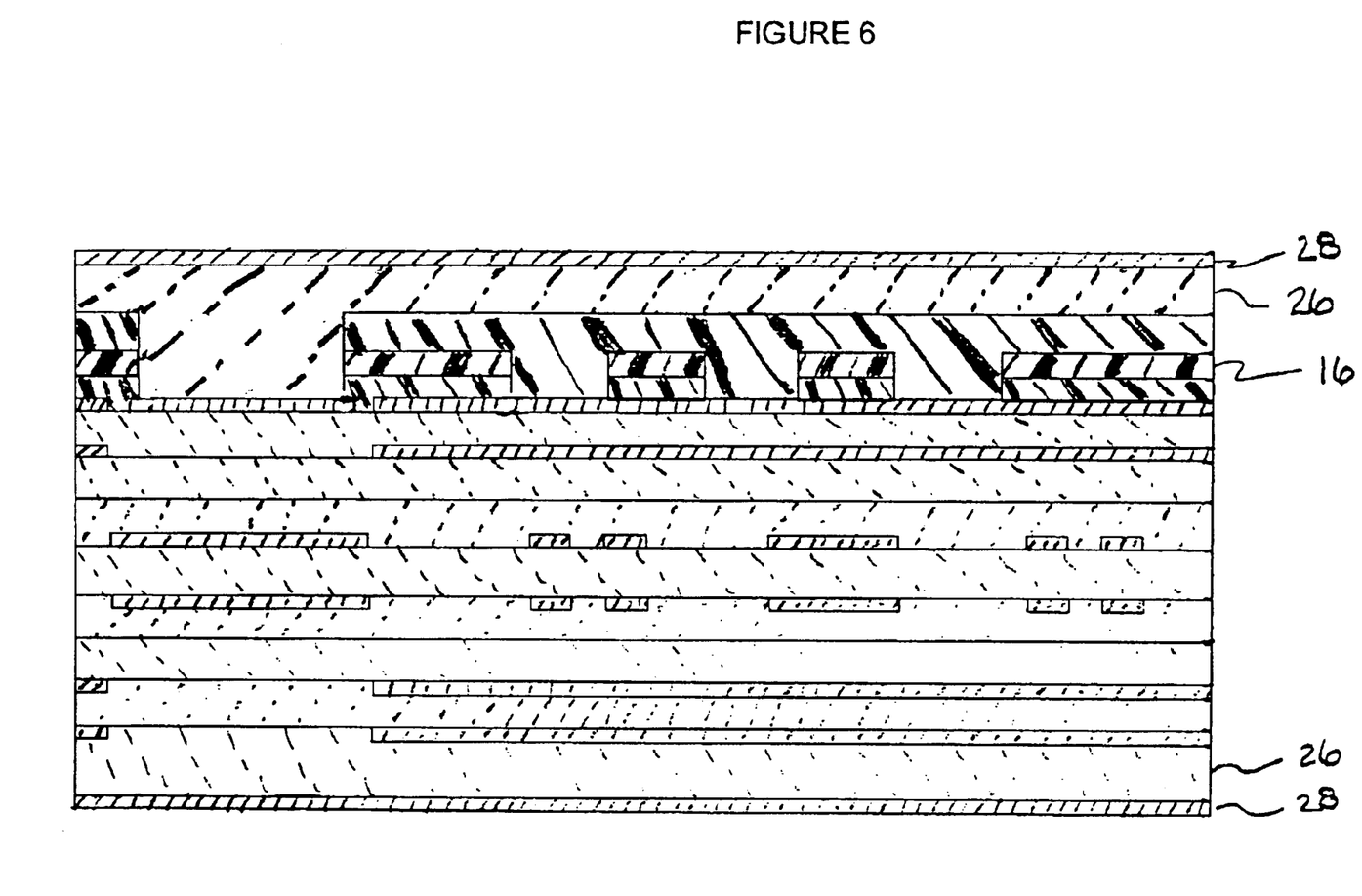
FIG. 6 illustrates a sectional view of the multi-layered PCB after "prepeg" and copper foil has been pressed in place prior to the insertion of through-holes.

Referring to FIG. 6, a sectional view is illustrated of the multi-layered PCB after "prepeg" and copper foil has been pressed in place prior to the insertion of through-holes. In one embodiment of the present invention, prepeg 26 (a non-conductive material) is pressed (laminated) on the top and bottom surfaces of the PCB. A layer of copper foil 28 is then pressed on each side to finish the multi-layered PCB in anticipation of inserting through-holes.

Figure 7:
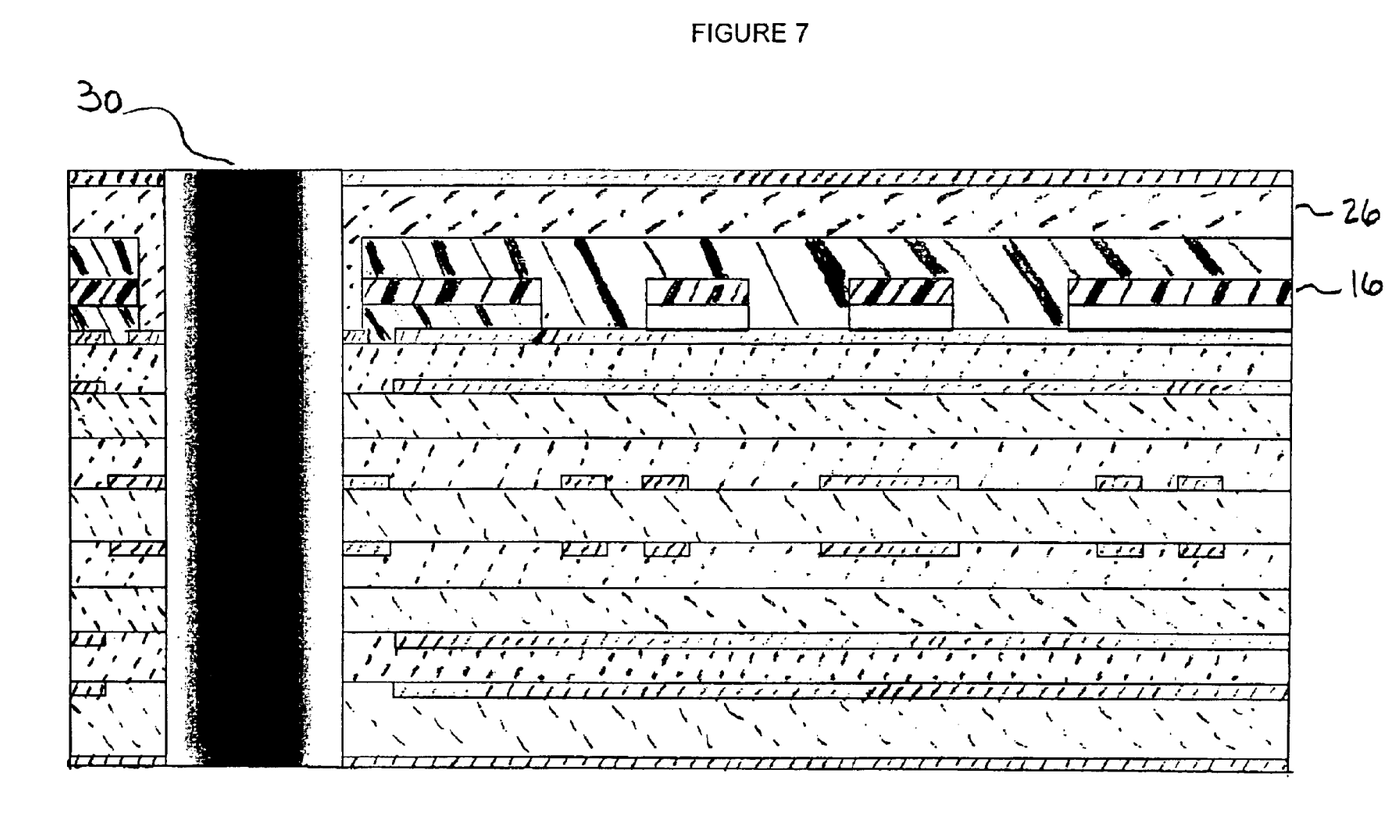
FIG. 7 illustrates a sectional view of the multi-layered PCB after drilling of a through-hole.

Referring to FIG. 7, a sectional view of the multi-layered PCB after drilling of a through-hole is illustrated. A through-hole 30 is then inserted. One embodiment of the present invention inserts the through-hole by a mechanical drilling of the multi-layered PCB. The through-hole 30 is used for mounting components or used as a via hole to access internal layers of the PCB. The removal of polymer material does not compromise the through-hole integrity. The prepeg material 26 maintains the sidewalls of the through-hole. Note that the optical waveguides 16 are preserved.

The present invention, "System and Method for Integrating Optical Layers in a PCB for Inter-Board Communications" has been described in terms of preferred embodiments. It will be appreciated that various modifications and improvements may be made to the described embodiments without departing from the scope of the invention.

What is claimed is:

1. A method for integrating an optical layer in a printed circuit board wherein the printed circuit board comprises an insulating material to which a first layer of copper foil is bonded, the method comprising:

preparing the printed circuit board;

laminating onto the copper layer a layer of first polymer material having a refraction index of n2;

laminating onto the layer of first polymer a layer of second polymer material having a refraction index of n1, where n1 is greater than n2;

creating a channel through the layers of first and second polymer material;

laminating a top layer of the first polymer material so as to fill the channel and cover the remaining layer of second polymer material;

laminating onto the top layer a layer of prepreg material; and laminating onto the prepreg material a second layer of copper foil.

2. The method of claim 1 wherein the coefficient of thermal expansion of the first and second polymer materials are substantially the same as the coefficient of thermal expansion of the printed circuit board.

3. The method of claim 1 wherein preparing the printed circuit board comprises roughing the first layer of copper foil.

4. The method of claim 3 wherein roughing the first layer of copper foil comprises roughing the first layer of copper foil by mechanical means.

5. The method of claim 3 wherein roughing the first layer of copper foil comprises roughing the first layer of copper foil by chemical means.

6. The method of claim 3 wherein preparing the circuit board further comprises imposing a plurality of marks on the first layer of copper wherein the marks define the path of a channel.

7. The method of claim 1 wherein creating channels in first and second layers of polymer material comprises ablating the layers with a laser.

8. The method of claim 6 wherein creating channels in first and second layers of polymer material further comprises:

aligning a laser with the plurality of marks; and ablating the first and second layers of polymer material along a path defined by the plurality of marks.

9. A method for integrating an optical layer in a printed circuit board wherein the printed circuit board comprises an insulating material to which a first layer of copper foil is bonded, the method comprising:

preparing the printed circuit board;

laminating onto the copper layer a layer of first polymer material having a refraction index of n2;

laminating onto the layer of first polymer a layer of second polymer material having a refraction index of n1, where n1 is greater than n2;

creating a channel through the layers of first and second polymer material;

identifying a location of an opening for mounting means;

creating a void in the layers of first and second polymer materials at the location of the opening;

laminating a top layer of the first polymer material so as to fill the channel and the void and cover the remaining layer of second polymer material;

laminating onto the top layer a layer of prepreg material;

laminating onto the prepreg material a second layer of copper foil; and creating an opening at the location of the opening for mounting means.

* * * * *